United States Patent [19]

Jung et al.

[11] Patent Number: 4,812,421
[45] Date of Patent: Mar. 14, 1989

[54] TAB-TYPE SEMICONDUCTOR PROCESS

[75] Inventors: Richard H. Jung, Park Ridge; Philip R. Logsdon, Arlington Heights, both of Ill.

[73] Assignee: Motorola, Inc., Schaumburg, Ill.

[21] Appl. No.: 112,593

[22] Filed: Oct. 26, 1987

[51] Int. Cl.⁴ .......................................... H01L 21/66
[52] U.S. Cl. ..................................... 437/211; 29/827; 29/835; 29/841; 264/272.11; 437/207; 206/330; 357/70
[58] Field of Search ................ 437/206, 207, 211; 29/827, 835, 841; 264/272.11; 206/330

[56] References Cited

U.S. PATENT DOCUMENTS

| 4,065,851 | 1/1978 | Kummer et al. | 437/206 |
| 4,331,740 | 5/1982 | Burns | 437/207 |

FOREIGN PATENT DOCUMENTS

| 0030873 | 3/1978 | Japan | 437/211 |
| 0050544 | 5/1981 | Japan | 437/211 |
| 0017646 | 2/1983 | Japan | 437/211 |
| 0041238 | 3/1985 | Japan | 437/206 |
| 0160625 | 8/1985 | Japan | 437/206 |

OTHER PUBLICATIONS

Article entitled "Motorola Adopts TapePak As Next Generation Packaging Standard", appearing on p. 6 of *National Anthem*, Jun./Jul. 87.
Article entitled "TAB Rebounds as I/Os Increase", by Markstein, appearing on p. 42 of *Electronic Packaging and Production*, Aug. 1986.

Primary Examiner—Brian E. Hearn
Assistant Examiner—Beverly A. Pawlikowski
Attorney, Agent, or Firm—John H. Moore

[57] ABSTRACT

A TAB (Tape Automated Bonding) process uses single-layer tapes to form a semiconductor structure. Beam leads on a metal tape are "inner-lead bonded" to a chip. Each chip site on a specially-formed plastic tape has a central portion and a peripheral portion which are bonded to the chip so that the central portion forms a protective cover over the chip and the peripheral portion acts as a support for the beam leads during probe testing, excising and forming operations, etc. The bottom surface of the chip preferably remains uncovered so that it can, if appropriate, be electrically connected to ground or another potential.

6 Claims, 3 Drawing Sheets

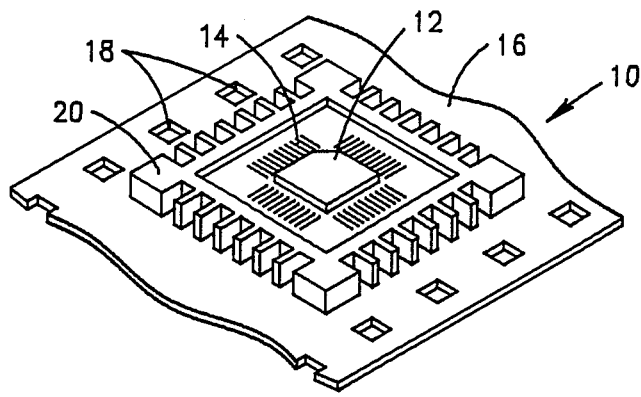
FIG. 1 —PRIOR ART—
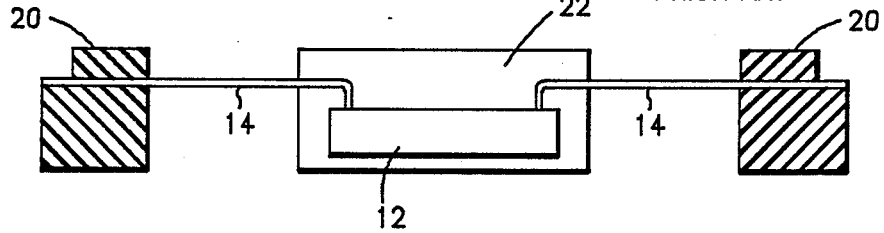
FIG. 2 —PRIOR ART—
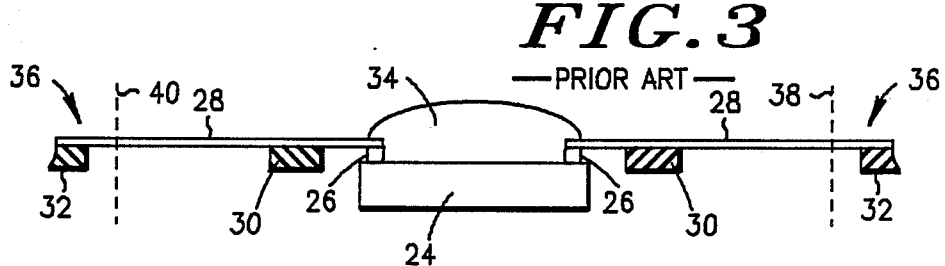
FIG. 3 —PRIOR ART—
FIG. 4

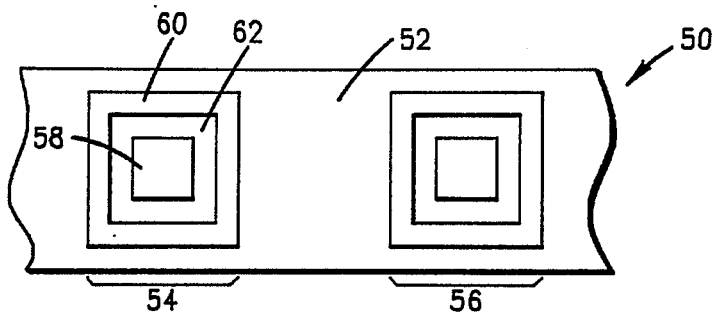
*FIG.5*
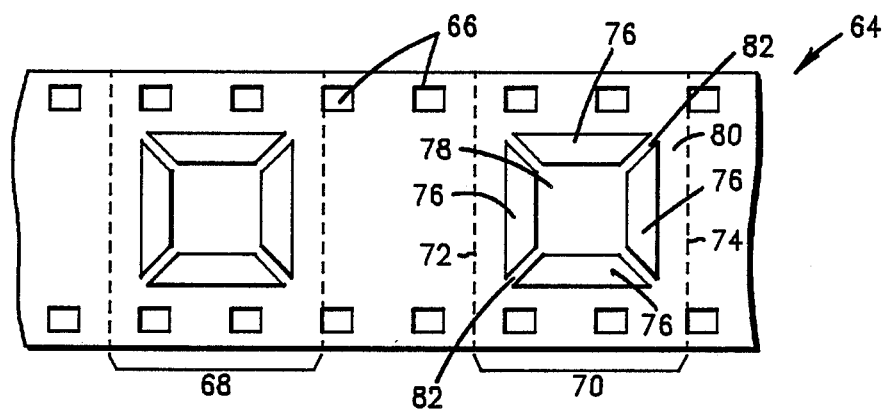
*FIG.6*
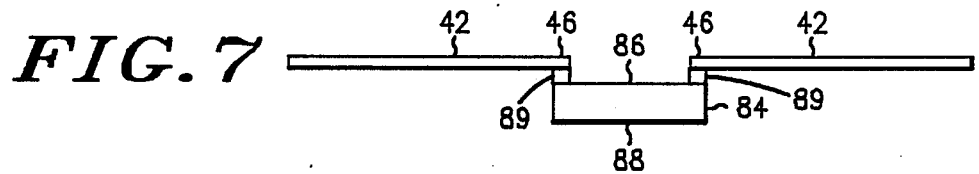
*FIG.7*
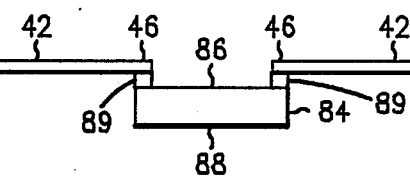
*FIG.8*
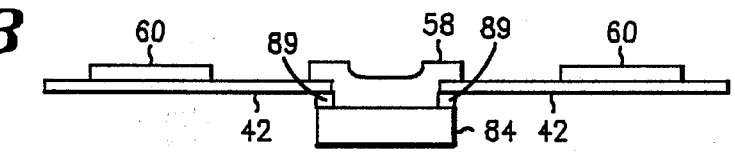
*FIG.9*
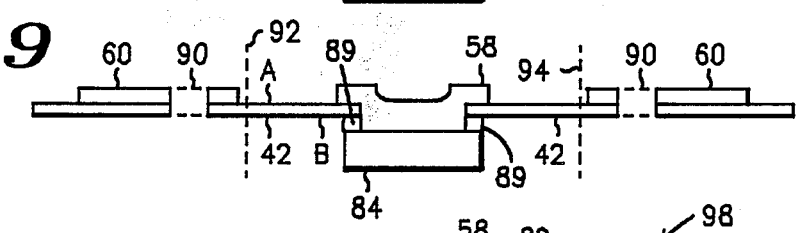
*FIG.10*
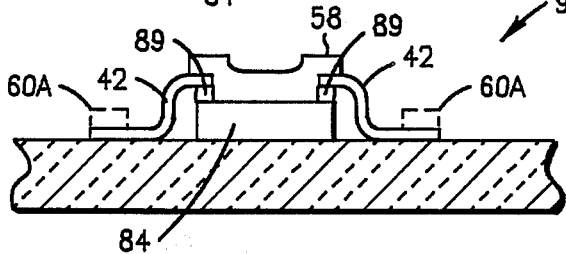

TAB-TYPE SEMICONDUCTOR PROCESS

FIELD OF THE INVENTION

This invention pertains to TAB (Tape Automated Bonding) processes for integrated circuit chips.

BACKGROUND OF THE INVENTION

In a typical TAB process, semiconductor chips are machine-positioned at die sites on a reel-to-reel tape which carries a pre-formed conductive pattern at each die site. The leads which extend from each chip are gang-bonded to the conductive pattern at the die site where the chip has been positioned. Efficiency of production and lower cost for high volume applications are among the goals of the TAB process.

To illustrate some of the problems associated with conventional TAB processes, two typical semiconductor structures, each resulting from a different TAB process, will be described briefly.

Turning first to the semiconductor structure shown in FIGS. 1 and 2, a conventional "tape pak" device 10 is shown. This device includes an integrated circuit chip 12 whose leads have been bonded to beam leads 14. The beam leads 14 are part of a metallized, conductive pattern that is formed on a single-layer metal tape 16. Sprocket holes 18 in the tape 16 permit the tape to be automatically indexed from one work station to another.

A rigid, molded support ring 20 encloses the illustrated die site to add rigidity to the overall structure during testing and burn-in procedures. Also, the chip 12 itself is encapsulated (as indicated by the reference numeral 22) with the same molding compound that is used to form the support ring 20.

Although the illustrated semiconductor structure is advantageous for some applications, it does have drawbacks. One disadvantage is that the protective encapsulation around the chip 12 prohibits making electrical connection to the bottom surface of the chip, as is needed in cases such as when the bottom surface of a microprocessor chip needs to be coupled to ground potential.

A second drawback is that the molding process which encapsulates the chip 12 and forms the support ring 20 slows down the TAB process and, therefore, adds to the cost. Moreover, encapsulation of the chip 12 makes it difficult to transfer heat out of the chip.

Another conventional semiconductor structure formed by a TAB-processes is shown in FIG. 3. This structure, shown in cross-section, includes an integrated circuit chip 24 whose leads 26 are bonded to beam leads 28 which are part of a metallized, conductive pattern on a continuous, two-layer tape. The top layer is a metal foil in which the pattern of beam leads is formed. The bottom layer of this tape is typically a plastic film that has been patterned to form a support ring 30 which surrounds the chip 24 to provide support for the beam leads 28. Another portion 32 of the plastic film underlies the outer ends of the beam leads 28. A protective encapsulating material 34 (epoxy, for example) covers at least the top surface of the chip 24.

The illustrated structure is tested by probing test areas 36 near the outer ends of the beam leads 28. Upon completion of the test, the outer ends of the leads 28 are excised along with the plastic film portions 32, as by cutting along the dotted lines 38 and 40. Thereafter, the beam leads are formed and bonded to a substrate (not shown).

The tape used in the structure of FIG. 3 is at least a two-layered tape comprising a top layer of metal (such as copper foil) and a bottom layer of plastic film. In some applications, such a structure requires a third, intermediate layer of adhesive between the layers of metal and plastic film.

There are several aspects of the structure shown in FIG. 3 that contribute to an undesirably high cost: the use of a two or three-layered tape; the requirement for a support ring; and a separate step to provide the protective coating over the chip.

OBJECTS OF THE INVENTION

It is a general object of the invention to provide an improved TAB process and semiconductor structure which overcomes the drawbacks discussed above.

It is a more specific object of the invention to provide a TAB process which uses single-layer tape(s), which does not require a separate process to provide a protective coating for the chip, and which provides support for the beam leads without adding complexity to the process.

It is another object of the invention to provide a less costly semiconductor structure that can be made using the improved TAB processes described herein.

BRIEF DESCRIPTION OF THE DRAWINGS

FIG. 1 shows a semiconductor structure made by a conventional TAB process;

FIG. 2 is a cross-sectional view of the structure shown in FIG. 1;

FIG. 3 is a cross-sectional view of a semiconductor structure made by another conventional TAB process;

FIG. 4 illustrates a single-layer, metal tape with a pattern of beam leads found thereon, for use according to the invention;

FIG. 5 shows patterns of polymer material, carried on a tape of release paper, for use according to the invention;

FIG. 6 shows a tape of polymer material patterned for use with the invention as an alternate to the arrangement shown in FIG. 5;

FIGS. 7, 8, 9 and 10 are cross-sectional views showing successive steps in the formation of a semiconductor structure according to the invention;

DESCRIPTION OF THE PREFERRED EMBODIMENT

Figure 11:
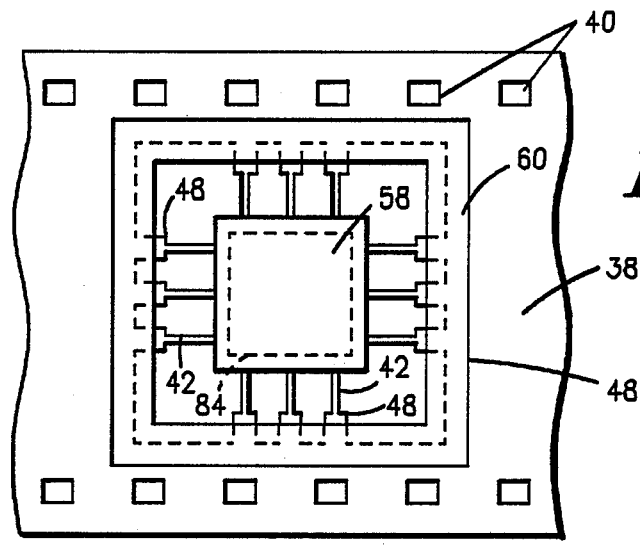
FIG. 11 is a top view of the structure shown in FIG. 8.

Referring to FIG. 4, a piece of continuous, single-layer metal tape 38 is shown. This tape, specially formed for use with the process described below, may include sprocket holes 40 for indexing the tape and advancing it between workstations in the conventional manner.

The illustrated portion of the tape 38 contains a single chip site at which a pattern of beam leads 42 has been formed around a centrally-located aperture 44. In the process described below, a semiconductor chip will be situated at the location of the aperture 44.

Each of the beam leads 42 includes a bondable end 46 which may be plated, and a test pad area 48 at the opposite end. Eventually, the bondable end 46 of each lead 42 becomes bonded to a lead or bonding area on a semiconductor chip, and the test pad areas 48 constitute locations for receiving a test probe.

For the sake of simplicity in the drawings, the lead pattern shown in FIG. 4 includes only three exemplary beam leads on each side of the aperture 44. However, a typical commercial pattern will include more beam leads. Also, the size and shape of the beam leads is not critical so long as they can be suitably bonded to a chip and be accessed by a test probe. The way in which the tape 38 is used is explained in more detail below.

Turning now to FIG. 5, another continuous tape 50 is shown. This tape comprises a layer of release paper 52 which carries a pre-formed pattern of polymer material (polyimide, for example) at each chip site. Two such identical sites 54 and 56 are shown in FIG. 5.

Referring to the site 54, the polymer material thereat includes a central portion 58 surrounded by a peripheral portion 60 and separated from the peripheral portion 60 by a gap 62.

Preferably, the central portion 58 is at least as large as the surface of the chip with which it will be used because it will serve as a protective cover for the chip. The function of the peripheral portion 60 will be discussed below along with the description of the present process. Suffice it to say at this point that the central portion 58 and the peripheral portion 60 may be peeled off the release paper 52 at the appropriate time.

Turning now to FIG. 6, a continuous, single-layer tape 64 illustrates an alternate to the tape 50 shown in FIG. 5. The tape 64, preferably made of a polymer material such as polyimide, is shown with two chip sites, 68 and 70, with sprocket holes 66 for indexing purposes. All the chip sites on the tape 64 are identical, so only the chip site 70 will be described.

For illustrative purposes, dashed lines 72 and 74 have been included in FIG. 6 to indicate the approximate boundaries of the chip site 70. Inside these boundaries, four holes 76 have been punched for the purpose of forming a central portion 78 of polymer material surrounded by and substantially separated from a peripheral portion 80. Web portions 82 connect the central portion 78 to the peripheral portion 80 to hold the central portion 78 in place.

Comparing FIG. 5 to FIG. 6, it can be seen that each of the tapes 50 and 64 include chip sites having central portions of polymer material 58, 78 that are surrounded by and substantially separated from periphery portions 60, 80.

The process which uses the metal tape 38 (FIG. 4) and the tape 52 (FIG. 5) will now be described. Referring to FIG. 7, a conventional semiconductor chip 84 is shown as having an upper or first surface 86 and a lower or second surface 88. The chip 84 has conventional chip leads or chip bonding pads 89 that are accessible from the first surface 86 of the chip. The chip 84 is mated with the metal tape 38 such that the bondable ends 46 of the beam leads 42 are situated as shown in FIG. 7, with each beam lead end 46 being aligned with and contacting one of the chip bonding pads 89. A conventional process known as "inner lead bonding" is then used to bond the end of each beam lead to its corresponding chip bonding pad 89.

The next step in the process involves using the polymer material carried by the tape 50. The tape's central portion 58 and peripheral portion 60 are removed from the release paper 52 and, as shown in FIG. 8, the central portion 58 of the polymer material is bonded to the first surface of the chip 84 and to the beam leads 42 such that the central portion 58 covers at least the chip's first surface 86. Preferably, the central portinn 58 also extends beyond the chip to overlap and partially cover the beam leads 42 as shown.

In the same bonding step, the peripheral portion 60 of the polymer material is bonded to the beam leads 42 such that the peripheral portion 60 covers at least part of each test pad area 48. As shown more clearly in FIG. 11, the chip 84 is situated at a chip site on the metal tape 38, the central portion 58 of the polymer material covers the first surface of the chip and overlaps onto the beam leads 42, and the peripheral portion 60 of polymer material surrounds the chp 84 and partially covers each of the test pad areas 48. With this structure, the central portion 58 acts as a protective cover for the chip 84, and simultaneously provides support for the beam leads 42 to the extent that the central portion 58 overlaps the beam leads. The peripheral portion 60 provides support for the other ends of the beam leads during subsequent probe tests, burn-in, and other procedures.

Bonding of the polymer material to the chip and to the beam leads may be done by conventional laminating techniques The polymer material may be provided in a B-stage form. Heat is applied to the polymer material and to the surfaces to which it will be bonded, and pressure is applied. Both of the pieces 58 and 60 may thus be bonded in the same step.

It will be noted (FIG. 8) that the central portion 58 includes a slight depression in the area where it covers the chip 84. This occurs because the polymer material flows as it is pressed downwardly onto the chip 84.

The next step involves preparing the semiconductor structure for a probe test. As best shown in FIGS. 4 and 11, all the test pad areas 48 are initially shorted to each other. To conduct a probe test, the shorts are first removed by punching out sections 90 (FIG. 9) through the peripheral portions 60 and the underlying portion of the metal foil so that the inner portions of the beam leads are electrically isolated from each other. The remaining peripheral portion 60 of the polymer material continues to support the beam leads 42 during the probe tests.

Still referring to FIG. 9, the probe tests may be accomplished by bringing a test probe into contact with any of the exposed portions of the beam leads, such as at points A or B. After the probe testing is finished, the test pad areas 48 (best shown in FIGS. 4 and 11) may be excised from the semiconductor structure, as by cutting along dashed lines 92 and 94 (FIG. 9). This removes not only the test pad areas, but also the peripheral portion 60 of polymer material.

Alternately, the peripheral portion 60 may be enlarged to extend inwardly toward the chip 84 (as viewed in FIG. 11) to completely cover the upper surfaces of the test pad areas 48, and to partially cover the upper surfaces of the beam leads 42 where they extend between the chip 84 and the test pad areas 48. Thus, when the above-described cutting takes place, the inwardly extending part of the peripheral portion 60 will remain atop the beam leads 42.

Assuming that the excision has occurred along the lines 92 and 94 (FIG. 9), the next step forms the remaining portions of the beam leads and bonds them to conductors (not shown) on a carrier such as a substrate 96 (FIG. 10). This last step is usually referred to as "outer lead bonding" may be effected using conventional forming and bonding techniques.

The resulting semiconductor structure 98 (FIG. 10) includes the chip 84, a plurality of beam leads 42 bonded to conventional bonding pads 89 (or the equivalent) on the first surface of the chip and to conductors on the substrate 96, and the piece of polymer material 58 which stays with the structure to act as a protective cover. As mentioned previously, part of the peripheral portion 60 of polymer material may remain after excision. Such optional remaining part is shown in dashed lines as 60a in FIG. 10. Note also that the bottom surface of the chip 84 is adjacent to and exposed to the substrate 96. Because the polymer material does not cover the bottom surface of the chip, a direct electrical connection may be made between a conductor (not shown) on the substrate 96 and the bottom surface of the chip 84. As mentioned previously, this is advantageous in that some chips, microprocessors for example, frequently require that their bottom surfaces be coupled directly to ground. In addition, heat transfer from the chip 84 is relatively easy beaause the chip is not encapsulated.

The preceding discussion of FIGS. 7-11 was based on use of the tape 52 (FIG. 5). Alternately, the tape 64 may be used instead of the tape 50, the only differences being that the tape 64 is a single piece of material and that the pattern at site 70 includes webbed portions 82. Otherwise, the same process is used and the same structure results (except for any remaining portions of the web 82).

Figure 12:
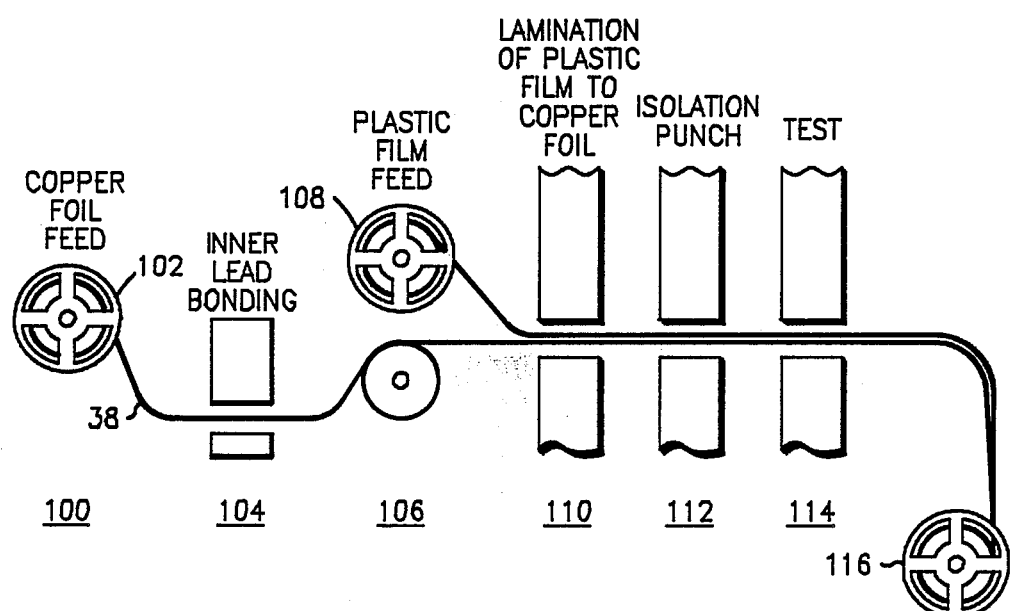
FIG. 12 is a schematic representation of various work stations used in an automated process for carrying out the present invention.

Manufacture of the semiconductor structure 98 preferably employs the steps discussed above, which steps may be implemented at consecutive workstations as shown in FIG. 12. At workstation 100, a supply reel 102 contains the single-layer copper foil tape 38, previously shown in detail in FIG. 4.

The tape is indexed in the conventional way to a second workstation 104, at which the inner-lead bonding step occurs. This causes the beam leads at a chip site on the tape 38 to be bonded to bonding pads on a chip (not shown) that is also situated at workstation 104. The resultant structure is as shown in FIG. 7.

At the next workstation 106, a reel 108 provides a supply of plastic film or tape such as shown in FIGS. 5 or 6. This plastic film (tape), along with the metal tape 38 which has been "inner-lead bonded" to chips, is indexed to the following workstation 110 where the plastic film is laminated to an underlying chip site to form the structure shown in FIG. 8.

At the next workstation 112, holes are punched through the plastic film and the underlying metal foil to electrically isolate the beam leads. The structure shown in FIG. 9 results.

Workstation 114 contains conventional test equipment for probe testing the semiconductor structure. After such testing has been completed, a take-up reel 116 may roll up the tested chips along with the attached plastic film (tape) and metal foil. The chips carried by the take-up reel 116 will subsequently be bonded to a carrier to form a completed semiconductor structure as shown in FIG. 10.

The advantages of the processes and structure discussed above include the lack of multi-layered tapes (the release paper 52 shown in FIG. 5 is not a layer which is used, except to act as a carrier for the polymer material). Also, the single layer of polymer material that is applied to a chip provides not only support for the beam leads, but also acts as a protective cover over the chip. The result is a relatively simple and less costly TAB process, and a reliable, less costly semiconductor structure.

Although the invention has been described in terms of preferred steps and structures, it will be obvious to those skilled in the art that many changes may be made without departing from the invention. Accordingly, it is intended that all such changes be considered as within the spirit and scope of the invention as defined by the appended claims.

We claim:

1. A process for forming a TAB-type semiconductor structure, comprising:
  (a) providing a semiconductor chip having a first surface and having chip bonding pads that are accessible from the first surface;
  (b) providing a metal tape that has a pattern of conductive beam leads formed thereon, the beam leads each having one bondable end that is to be bonded to a chip bonding pad and an opposite end that includes a test pad;
  (c) bonding the bondable ends of the beam leads to the chip bonding pads;
  (d) providing a polymer material that is shaped to include a central portion that is at least as large as the first surface of the chip, and a peripheral portion surrounding the central portion and substantially separated from the central portion by openings in the material;
  (e) bonding the polymer material to the chip and to the beam leads such that the central portion of the polymer material covers at least the first surface of the chip to form a protective layer thereon, and the peripheral portion of the polymer material covers at least part of each test pad on the beam leads to provide support for the beam leads; and
  (f) excising the test pads from the beam leads along with the peripheral portion of the polymer material that covers the excised test pads.

2. A process as set forth in claim 1 wherein the metal tape is a single layer, continuous tape having a series of sites which each include one of said patterns of beam leads.

3. A process as set forth in claim 2 wherein the polymer material is a single layer, continuous tape.

4. A process as set forth in claim 2 wherein the polymer material is carried on a continuous tape of release paper.

5. A process as set forth in claim 1 wherein the chip has a second surface, and further including the steps of:
  providing a carrier; and
  bonding the unbonded ends of the beam leads to the carrier such that the second surface of the chip is adjacent and exposed to the carrier.

6. A process for forming a TAB-type semiconductor structure, comprising:
  (a) providing a semiconductor chip having first and second surfaces, and having chip bonding pads that are accessible from the first surface;
  (b) providing a single layer, continuous metal tape that has a plurality of chip sites thereon, each such site having a pattern of conductive beam leads, and each such beam lead having one bondable end that is to be bonded to a chip bonding pad and an opposite end that includes a test pad;
  (c) bonding the bondable ends of the beam leads to the chip bonding pads;

(d) providing a polymer material that is shaped to include a central portion that is sized to cover the first surface of the chip, and a peripheral portion surrounding and substantially separated from the central portion by openings in the polymer material;

(e) bonding the polymer material to the chip and to the beam leads such that the central portion of the polymer material substantially covers the first surface of the chip to form a protective layer thereon, the peripheral portion of the polymer material covers at least part of each test pad on the beam leads to provide support for the beam leads, and the second surface of the chip remains uncovered by the polymer material; and (f) excising the test pads from the beam leads along with the peripheral portion of the polymer material that covers the excised test pads.

* * * * *